US008343871B2

(12) United States Patent
Shih et al.

(10) Patent No.: US 8,343,871 B2
(45) Date of Patent: Jan. 1, 2013

(54) METHOD FOR FABRICATING FINE PATTERNS OF SEMICONDUCTOR DEVICE UTILIZING SELF-ALIGNED DOUBLE PATTERNING

(75) Inventors: Tah-Te Shih, Taichung County (TW); Chung-Yuan Lee, Tao-Yuan (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 474 days.

(21) Appl. No.: 12/717,923

(22) Filed: Mar. 4, 2010

(65) Prior Publication Data

US 2011/0159691 A1 Jun. 30, 2011

(30) Foreign Application Priority Data

Dec. 31, 2009 (TW) ............................... 98146610 A

(51) Int. Cl.
*H01L 21/302* (2006.01)

(52) U.S. Cl. ......... 438/689; 438/690; 438/717; 257/734

(58) Field of Classification Search .................. 257/401, 257/52, 20, 734; 430/5, 312, 313, 314; 438/618, 438/622, 717, 734, 231, 301, 303, 592, 978, 438/689, 690, 692, 694, 696, 700, 702, 706, 438/743, 763; 216/40, 41; 361/321.4; 428/336; 716/50

See application file for complete search history.

(56) References Cited

U.S. PATENT DOCUMENTS

| | | | | |
|---|---|---|---|---|
| 7,064,078 | B2 | 6/2006 | Liu | |
| 7,576,009 | B2 | 8/2009 | Lee | |
| 2003/0127426 | A1* | 7/2003 | Chang et al. | 216/41 |
| 2004/0192060 | A1* | 9/2004 | Stegemann et al. | 438/713 |
| 2005/0272259 | A1* | 12/2005 | Hong | 438/669 |
| 2007/0205438 | A1* | 9/2007 | Juengling | 257/216 |
| 2008/0305642 | A1* | 12/2008 | Lee et al. | 438/703 |
| 2009/0208886 | A1 | 8/2009 | Takemura | |

FOREIGN PATENT DOCUMENTS

TW 200809921 2/2008

OTHER PUBLICATIONS

Pang et al., Amorphous Carbon Films as Planarization Layers Deposited by Plasma-Enhanced Chemical Vapor Deposition, IEEE Electron Device Letters, vol. 11, No. 9, Sep. 1990, p. 391-393.*

* cited by examiner

*Primary Examiner* — Duy Deo
*Assistant Examiner* — Erin Bergner
(74) *Attorney, Agent, or Firm* — Winston Hsu; Scott Margo

(57) ABSTRACT

A method for making a semiconductor device includes forming a first mask pattern on a device layer, forming a second mask pattern on the first mask pattern, etching the device layer not covered by the first and second mask patterns to thereby form a first trench, trimming the first mask pattern to form an intermediate mask pattern, depositing a material layer to fill the first trench, polishing the material layer to expose a top surface of the intermediate mask pattern, removing the intermediate mask pattern to form an opening, etching the device layer through the opening to thereby form a second trench.

16 Claims, 6 Drawing Sheets

METHOD FOR FABRICATING FINE PATTERNS OF SEMICONDUCTOR DEVICE UTILIZING SELF-ALIGNED DOUBLE PATTERNING

BACKGROUND OF THE INVENTION

1. Field of the Invention

The present invention relates generally to the field of semiconductor device manufacturing. More particularly, the present invention relates to a method for fabricating fine patterns of semiconductor device utilizing self-aligned double patterning technique.

2. Description of the Prior Art

The tremendous growth of the semiconductor industry has been achieved by reducing the cost per function of integrated circuits. The semiconductor industry has kept on the historic productivity curve by improving equipment performance, throughput, and uptime; by improving manufacturing yield and efficiency; by improving product quality and reliability; and by increasing wafer size. The most significant contributor to keeping on the historic productivity curve has been by reducing integrated circuit feature sizes through advances in lithography. Reduction in feature sizes allows semiconductor manufacturers to fabricate more devices per wafer, reduce the size (hence the cost) per device, and increase the performance of each device. These advances translate into consumer benefits through electronic products that are smaller, cheaper, and superior in performance.

However, as the semiconductor technology advances to 50 nm node or beyond, for example, it is required to combine extra resolution enhancing techniques such as immersion lithography techniques and/or double patterning techniques in order to fabricate fine pattern of ultra-high density semiconductor devices with feature of 50 nm or less and to elongate the life of today's mainstream 193 nm optical lithography systems.

As known in the art, optical lithography systems are used to remove individual parts of a thin film or substrate. The system transfers a pattern from a photo mask to a photoresist using light. Chemicals are then used to etch the pattern in, beneath the photoresist. To prepare for this process, the wafer may be heated in order to remove the excess moisture from the wafer surface.

A photoresist is then applied through spin coating. Once it is reheated or baked, driving away any lingering solvent, the resist is then exposed to the light pattern. This exposes the basic pattern to the resist and then allows it to be etched on using a chemical agent. The photoresist can then be removed with the use of a resist stripper. The printing systems used for this process require a mask that lets in some light while keeping out other rays, creating a specific pattern. This type of mask lithography is well known in the art and is most commonly used in industries.

Double patterning technique utilizing self-aligned spacer is also known in the art. For example, a spacer layer is formed by deposition on the previous pattern, followed by etching to remove all the spacer layer material on the horizontal surfaces, leaving only the spacer layer material on the sidewalls. By removing the original patterned feature, only the spacer is left. Since there are two spacers for every line, the line density has now doubled. The spacer technique is applicable for defining narrow gates at half the original lithographic pitch, for example. The spacer approach is unique in that with one lithographic exposure, the pitch can be halved indefinitely with a succession of spacer formation and pattern transfer processes.

However, the above-described double patterning technique utilizing self-aligned spacer has several drawbacks such as corner rounding or variation of the feature size across the wafer when using the spacer as an etching hard mask. In light of the above, there is a strong need in this industry to provide an improved method for fabricating a very fine pattern of semiconductor device with a feature size of at least 50 nm or below without the above-described drawbacks.

SUMMARY OF THE INVENTION

It is one object of the present invention to provide an improved method for fabricating very fine patterns of semiconductor device in order to solve the above-mentioned prior art problems and shortcomings.

According to the claimed invention, a method for fabricating fine patterns of semiconductor device utilizing self-aligned double patterning is provided. The method includes providing a device layer; forming a first mask pattern on the device layer; forming a second mask pattern on the first mask pattern, wherein the second mask pattern partially covers the first mask pattern; selectively etching the device layer not covered by the first and second mask patterns to thereby form a first trench therein; removing the first mask pattern not covered by the second mask pattern to form an intermediate mask pattern; depositing a mask material layer to fill the first trench and cover the intermediate mask pattern; polishing the mask material layer to expose a top surface of the intermediate mask pattern, thereby forming a third mask pattern; selectively removing the intermediate mask pattern to form an opening; and etching the device layer through the opening to thereby form a second trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
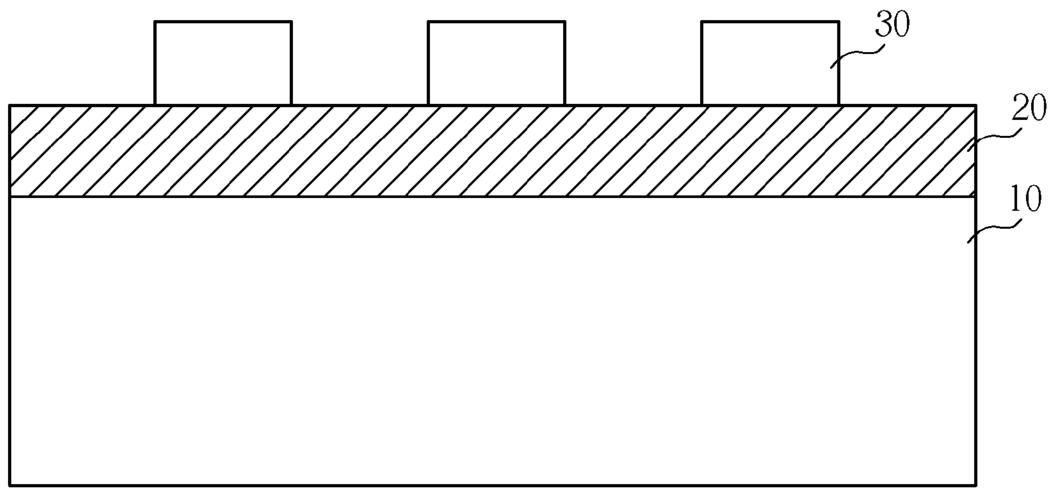
FIGS. 1-11 are schematic, cross-sectional diagrams showing a method for fabricating fine patterns of semiconductor device utilizing self-aligned double patterning in accordance with one preferred embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

One or more implementations of the present invention will now be described with reference to the attached drawings, wherein like reference numerals are used to refer to like elements throughout, and wherein the illustrated structures are not necessarily drawn to scale.

FIGS. 1-11 are schematic, cross-sectional diagrams showing a method for fabricating fine patterns of semiconductor device utilizing self-aligned double patterning in accordance with one preferred embodiment of this invention. As shown in FIG. 1, a device layer 10 is provided. In one embodiment, the device layer 10 may be a semiconductor substrate including bur not limited to a silicon substrate. In another embodiment, the device layer 10 may be a dielectric layer including but not limited to silicon oxide. In still another embodiment, the device layer 10 may be a multi-layer stack structure including but not limited to polysilicon-tungsten-silicon nitride stack structure. A first mask layer 20 is formed on a top surface of the device layer 10.

According to the preferred embodiment, the first mask layer 20 has high etching selectivity to the device layer. For example, the device layer 10 is silicon oxide and the first mask layer 20 is polysilicon. After the formation of the first mask layer 20, a photoresist pattern 30 is formed on the first mask layer 20. According to the preferred embodiment, for example, the photoresist pattern 30 may be a plurality of dense line patterns and has a line width to space ratio (L:S) of 1:1.

Figure 2:
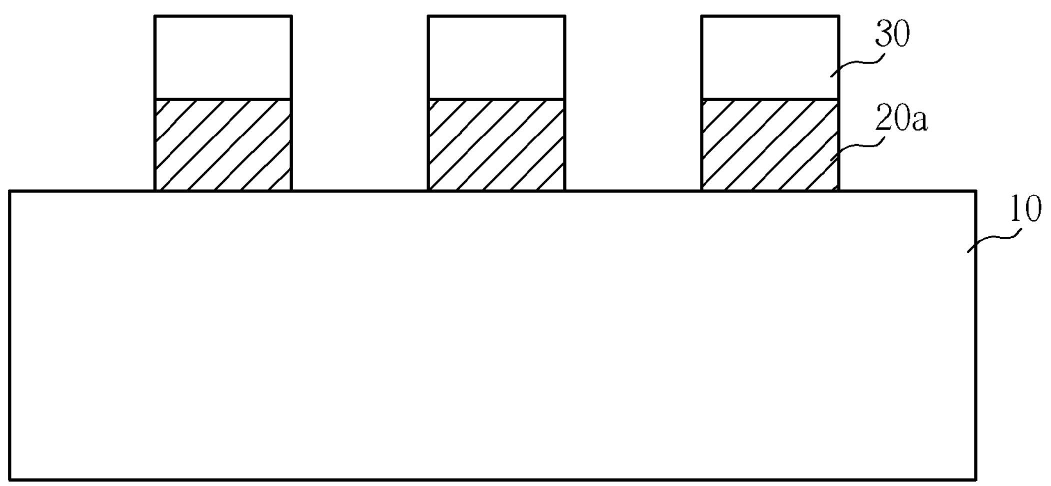

As shown in FIG. 2, using the photoresist pattern 30 as an etch mask, an etching process such as an anisotropic dry etching process is carried out to etch away the portion of the first mask layer 20 not covered by the photoresist pattern 30 and expose a portion of the underlying device layer 10, thereby forming a first mask pattern 20*a*. According to the preferred embodiment of this invention, the first mask pattern 20*a* may be a plurality of dense line patterns and has a line width to space ratio (L:S) of 1:1. Subsequently, the photoresist pattern 30 is stripped off.

Figure 3:
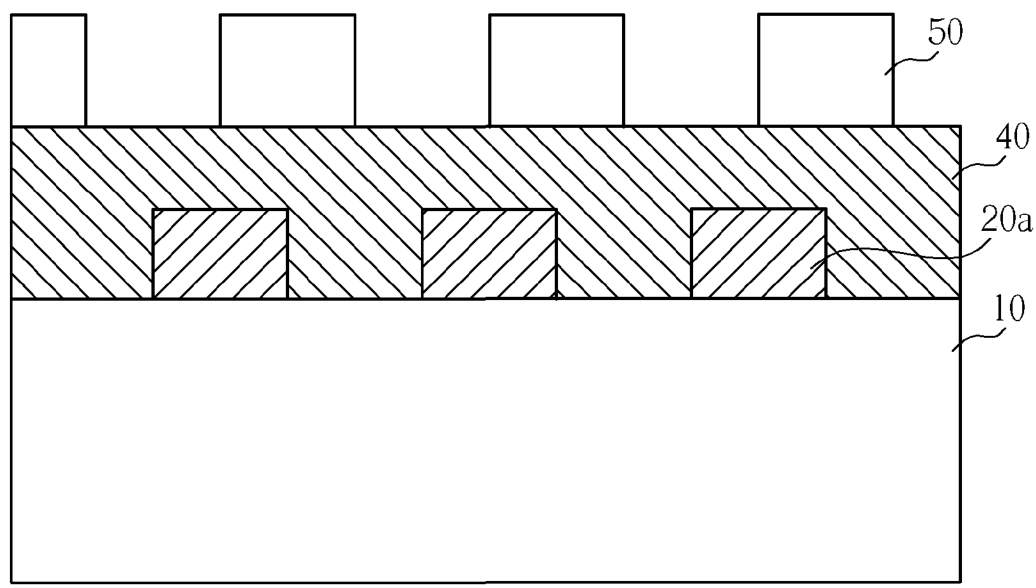

As shown in FIG. 3, a second mask layer 40 is formed on the first mask pattern 20*a*. The second mask layer 40 covers the first mask pattern 20*a* and fills into the gap or space of the first mask pattern 20*a*. According to the preferred embodiment of this invention, the second mask layer 40 has high etching selectivity to both the device layer 10 and the first mask pattern 20*a*. For example, the device layer 10 is a silicon oxide layer, the first mask pattern 20*a* is a polysilicon layer, and the second mask layer 40 is a carbon layer or an amorphous carbon layer. In another embodiment, an anti-reflection coating layer such as a dielectric anti-reflection coating (DARC) layer may be formed on the second mask layer 40. The aforesaid DARC layer may include but not limited to silicon nitride.

Subsequently, a photoresist pattern 50 is formed on the second mask layer 40. According to the preferred embodiment, for example, the photoresist pattern 50 may be a plurality of dense line patterns and has a line width to space ratio (L:S) of 1:1. Notably, the photoresist pattern 50 laterally shifts a small distance, for example, an offset of about half pitch, such that the photoresist pattern 50 only partially overlaps with the underlying first mask pattern 20*a*. The aforesaid "pitch" equals to the sum of the line width and the space.

Figure 4:
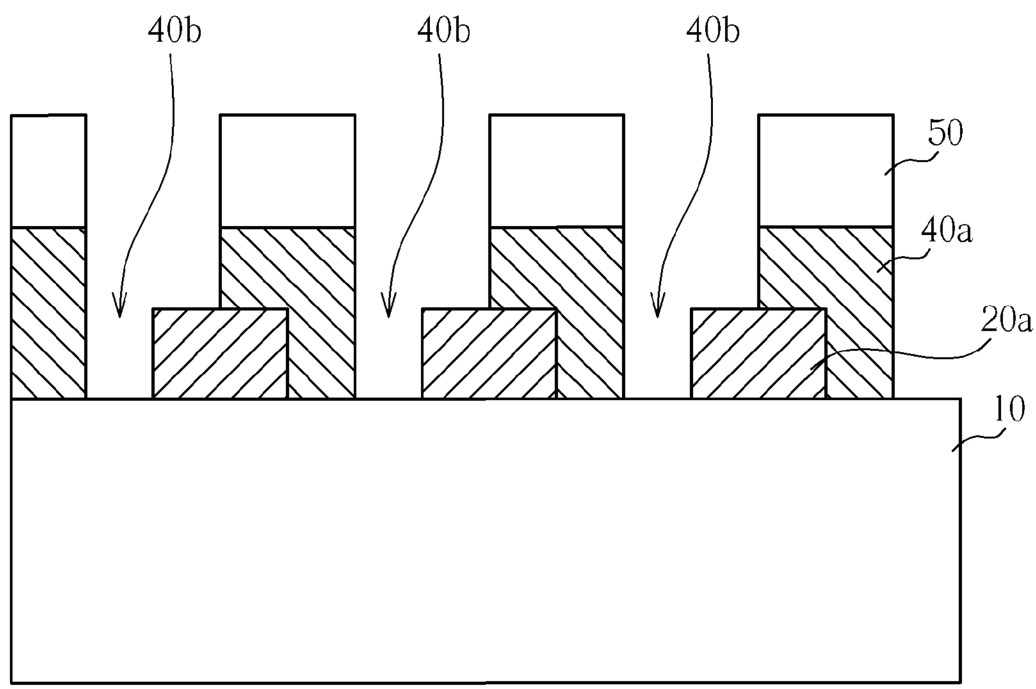

As shown in FIG. 4, using the photoresist pattern 50 as an etch mask, an etching process such as an anisotropic dry etching process is carried out to selectively etch away the second mask layer 40 not covered by the photoresist pattern 50, thereby forming a second mask pattern 40*a*. At this point, the vertical sidewall of the second mask pattern 40*a* and the vertical sidewall of the first mask pattern 20*a* together define an opening 40*b*. For example, the width of the opening 40*b* is about half of the original space of the first mask pattern 20*a*.

Figure 5:
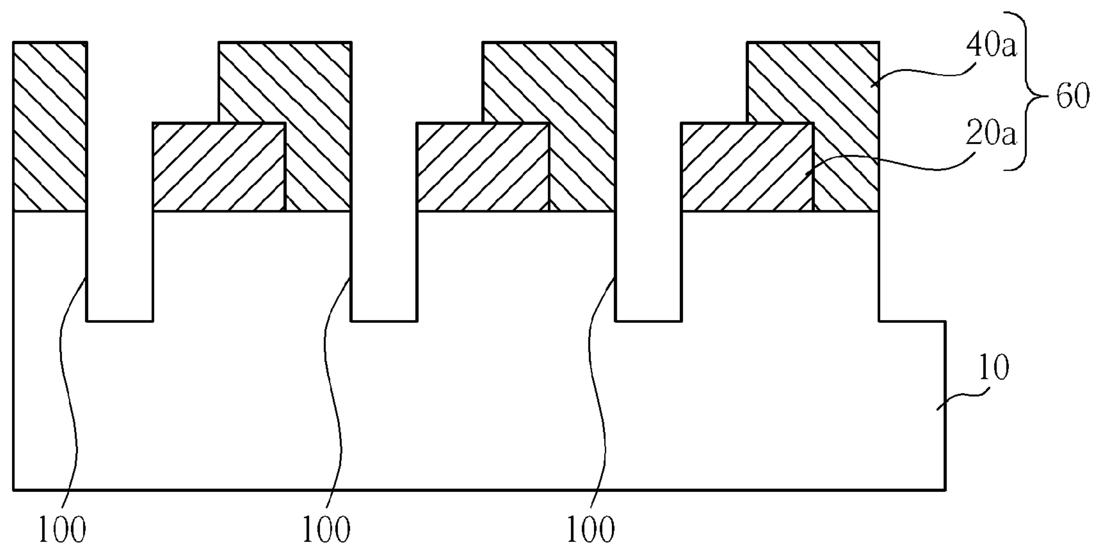

As shown in FIG. 5, thereafter, using the first mask pattern 20*a* and the second mask pattern 40*a* as an etching hard mask 60, an etching process such as an anisotropic dry etching process is carried out to selectively etch the device layer 10 not covered by the etching hard mask 60, thereby forming a first trench 100.

Figure 6:
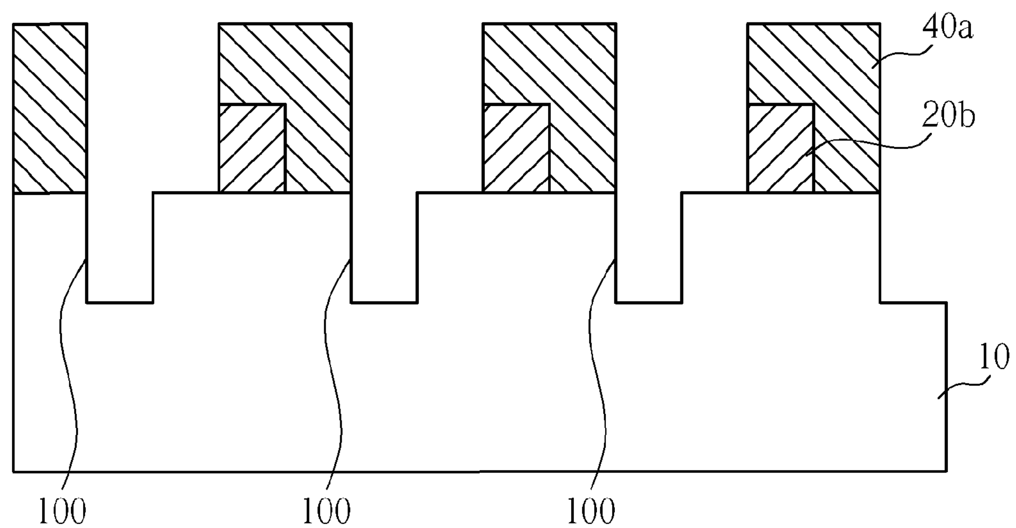

As shown in FIG. 6, after the formation of the first trench 100 in the device layer 10, the second mask pattern 40*a* alone is used as an etching hard mask and an etching process such as an anisotropic dry etching process is then carried out to selectively remove the first mask pattern 20*a* not covered by the second mask pattern 40*a*, thereby forming an intermediate mask pattern 20*b* in a self-aligned fashion. This etching step may be deemed as a trimming step of the first mask pattern, in one aspect, and this etching step only selectively etches the first mask pattern 20*a* but leaves the second mask pattern 40*a* and the device layer 10 substantially intact.

Figure 7:
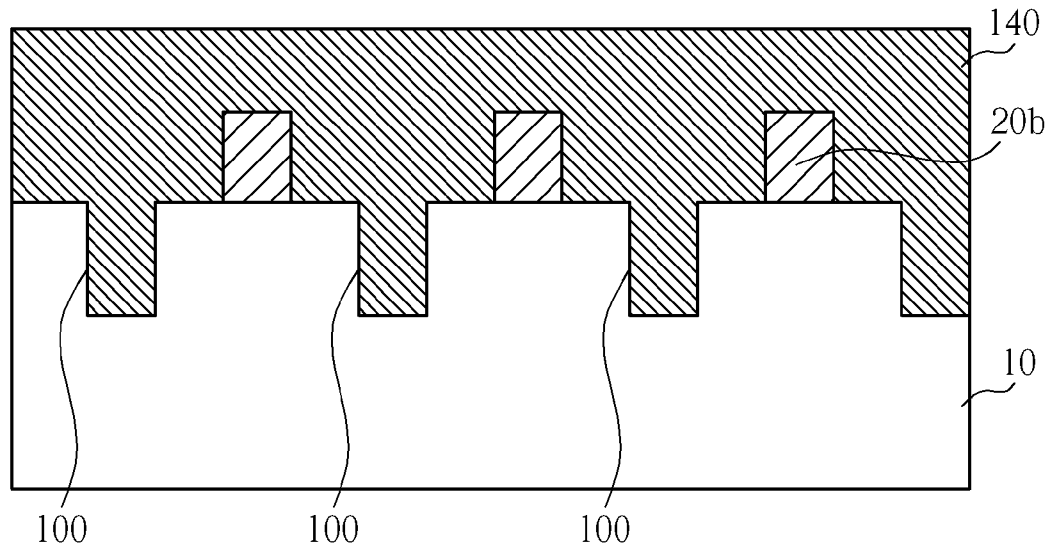

As shown in FIG. 7, a third mask layer 140 is deposited on the device layer 10. The third mask layer 140 covers the intermediate mask pattern 20*b* and fills into the first trench 100 and the space of the intermediate mask pattern 20*b*. Notably, prior to the deposition of the third mask layer 140, the second mask pattern 40*a* may be optionally removed. The third mask layer 140 and the second mask pattern 40*a* may be made of the same material, for example, carbon or amorphous carbon, which can be deposited by conventional plasma-enhanced chemical vapor deposition (PECVD) methods, but not limited thereto. Of course, it is understood that the third mask layer 140 and the second mask pattern 40*a* may be made of different materials. Most importantly, the third mask layer 140 must has high etching selectivity to both the intermediate mask pattern 20*b* and the device layer 10.

Figure 8:
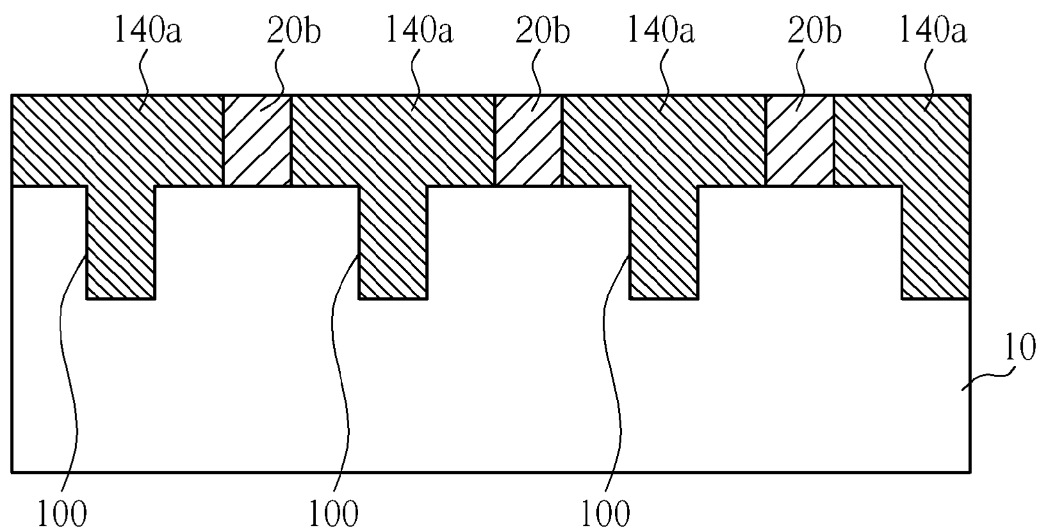

As shown in FIG. 8, subsequently, a chemical mechanical polishing (CMP) process is carried out to remove a predetermined upper thickness of the third mask layer 140 until a top surface of the intermediate mask pattern 20*b* is revealed, thereby forming a third mask pattern 140*a* in a self-aligned fashion.

Figure 9:
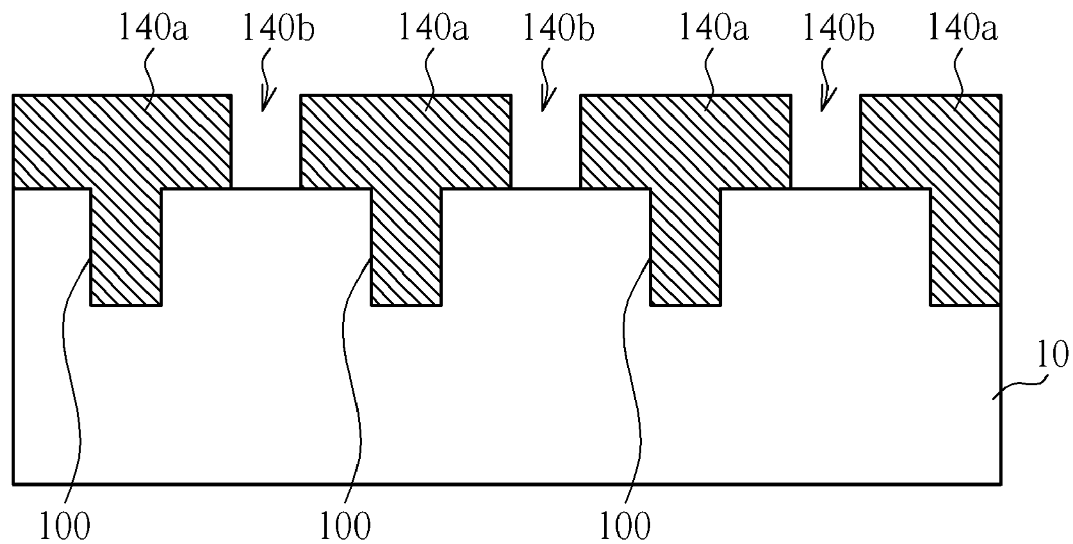

As shown in FIG. 9, after the CMP process, the third mask pattern 140*a* is used as an etching hard mask an etching process such as an anisotropic dry etching process is then carried out to selectively etch away the intermediate mask 20*b*, thereby forming an opening 140*b*.

Figure 10:
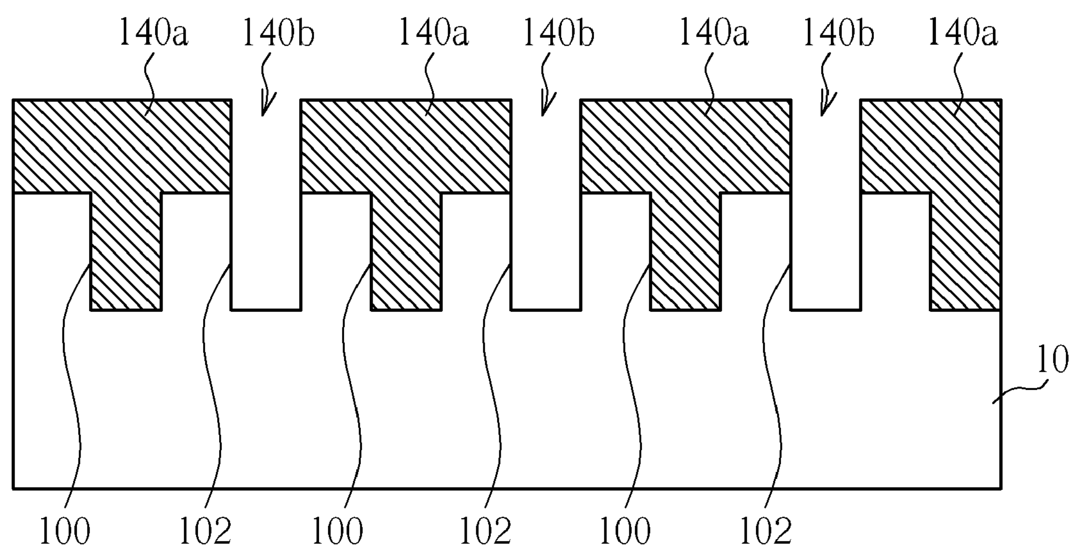
Figure 11:
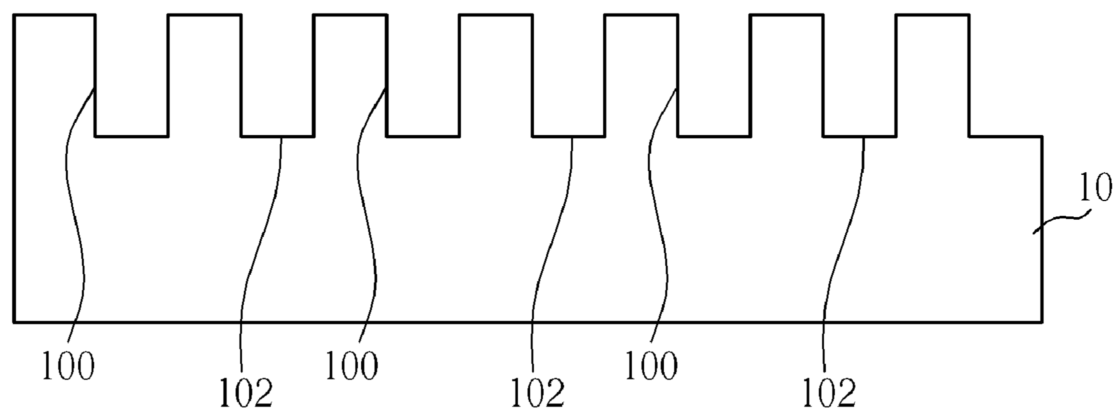

As shown in FIG. 10, after the removal of the intermediate mask pattern 20*b*, the third mask pattern 140*a* is used as an etching hard mask and an etching process such as an anisotropic dry etching process is then carried out to etch the device layer 10 through the opening 140*b* thereby forming a second trench 102 in the device layer 10, wherein each of the second trench 102 is formed between two of the first trenches 100. According to the preferred embodiment of this invention, the first trench 100 and the second trench 102 may have the same trench depth. However, it is understood that the first trench 100 and the second trench 102 may have different trench depths in another embodiment. Thereafter, the third mask pattern 140*a* is removed, as shown in FIG. 11.

Those skilled in the art will readily observe that numerous modifications and alterations of the device and method may be made while retaining the teachings of the invention.

What is claimed is:

1. A method for fabricating fine patterns of semiconductor device utilizing self-aligned double patterning, comprising:

providing a device layer;

forming a first mask pattern on the device layer;

forming a second mask pattern on the first mask pattern, wherein the second mask pattern partially covers the first mask pattern;

selectively etching the device layer not covered by the first and second mask patterns to thereby form a first trench therein;

after forming the first trench, removing the first mask pattern not covered by the second mask pattern to form an intermediate mask pattern;

depositing a mask material layer to fill the first trench and cover the intermediate mask pattern;

polishing the mask material layer to expose a top surface of the intermediate mask pattern, thereby forming a third mask pattern;

selectively removing the intermediate mask pattern to form an opening; and etching the device layer through the opening to thereby form a second trench.

2. The method according to claim 1 wherein the device layer is a dielectric layer.

3. The method according to claim 2 wherein the dielectric layer comprises silicon oxide.

4. The method according to claim 1 wherein the device layer is a semiconductor substrate.

5. The method according to claim 4 wherein the semiconductor substrate comprises silicon substrate.

6. The method according to claim 1 wherein the device layer is a multi-layer stack structure.

7. The method according to claim 6 wherein the multi-layer stack structure comprises polysilicon-tungsten-silicon nitride stack structure.

8. The method according to claim 1 wherein the first mask pattern comprises polysilicon.

9. The method according to claim 1 wherein the second mask pattern comprises carbon.

10. The method according to claim 1 wherein the second mask pattern comprises amorphous carbon.

11. The method according to claim 1 wherein the mask material layer and the second mask pattern are composed of the same material.

12. The method according to claim 1 wherein the mask material comprises carbon or amorphous carbon.

13. The method according to claim 1 wherein the first mask pattern comprises a plurality of dense line patterns.

14. The method according to claim 13 wherein line width to space ratio (L:S) of the plurality of dense line patterns is 1:1.

15. The method according to claim 1 wherein an anti-reflection coating layer is provided on the second mask pattern.

16. The method according to claim 1 wherein after forming the second mask pattern on the first mask pattern, the first mask pattern and the second mask pattern together form an etching hard mask with a step structure.

* * * * *